(12) United States Patent
Fischer

(10) Patent No.: US 8,305,130 B2
(45) Date of Patent: Nov. 6, 2012

(54) CLAMP CIRCUIT USING PMOS AND NMOS DEVICES

(75) Inventor: Jonathan H. Fischer, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/838,435

(22) Filed: Jul. 17, 2010

(65) Prior Publication Data

US 2012/0013384 A1   Jan. 19, 2012

(51) Int. Cl.
*H03K 5/08* (2006.01)
(52) U.S. Cl. .................. 327/321; 327/309
(58) Field of Classification Search .......... 327/306, 327/309, 312, 331, 321
See application file for complete search history.

(56) References Cited

U.S. PATENT DOCUMENTS

| | | | |
|---|---|---|---|
| 5,770,964 A * | 6/1998 | Suma | 327/328 |
| 5,955,908 A | 9/1999 | Tam | |
| 6,037,759 A * | 3/2000 | Chen et al. | 323/280 |
| 6,232,805 B1 * | 5/2001 | Brandt | 327/108 |
| 6,242,972 B1 | 6/2001 | Fatemizadeh | |
| 6,535,368 B2 | 3/2003 | Andresen et al. | |
| 6,670,840 B1 | 12/2003 | Kiani et al. | |
| 6,985,019 B1 * | 1/2006 | Zhou et al. | 327/309 |
| 2006/0232318 A1 | 10/2006 | Iwahori et al. | |
| 2009/0174373 A1 | 7/2009 | Cheng et al. | |

\* cited by examiner

*Primary Examiner* — Dinh T. Le

(74) *Attorney, Agent, or Firm* — Prakash Nama; Global IP Services, PLLC

(57) ABSTRACT

A MOS-type semiconductor clamping circuit is disclosed. The clamping circuit comprises a pmos device coupled to a nmos device in series to form the clamping circuit to selectively clamp a signal to a reference voltage, the signal configured to swing between a first voltage and a second voltage about the reference voltage. When the signal is swung between the first voltage and the second voltage, the pmos device and the nmos device are subjected to a voltage swing less than the voltage swing between the first voltage and the second voltage.

10 Claims, 9 Drawing Sheets

US 8,305,130 B2

CLAMP CIRCUIT USING PMOS AND NMOS DEVICES

FIELD OF TECHNOLOGY

Embodiments of the present invention relate to semiconductor devices. More particularly, embodiments of the present invention relate to clamp circuits.

BACKGROUND

Clamp circuits are used in certain applications to clamp an input or an output to a predetermined voltage level. For example, input of a sensor used in a disk drive application may need to be clamped to ground potential, when the sensor is not active. As circuit density and bandwidth requirements for many state of the art applications such as preamps for hard disk drives increase, fine line CMOS technology is used. To achieve the power, bandwidth and die size goals, the CMOS device dimensions are scaled down to sub micron dimensions. The voltage ratings of the devices are also scaled down. For example, in a 0.25 um CMOS technology, the devices typically are rated for voltages less than 3.6 Volts across the CMOS device gate and between drain-to-source.

As the voltage ratings of the devices are scaled down, there is a need to provide for clamp circuits that operate within the rated voltage. It is with these needs in mind, the current disclosure arises.

BRIEF DESCRIPTION OF THE DRAWINGS

Various preferred embodiments are described herein with reference to the drawings, wherein.

The drawings described herein are for illustration purposes only and are not intended to limit the scope of the present disclosure in any way.

DETAILED DESCRIPTION

Systems and devices for clamp circuits are disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
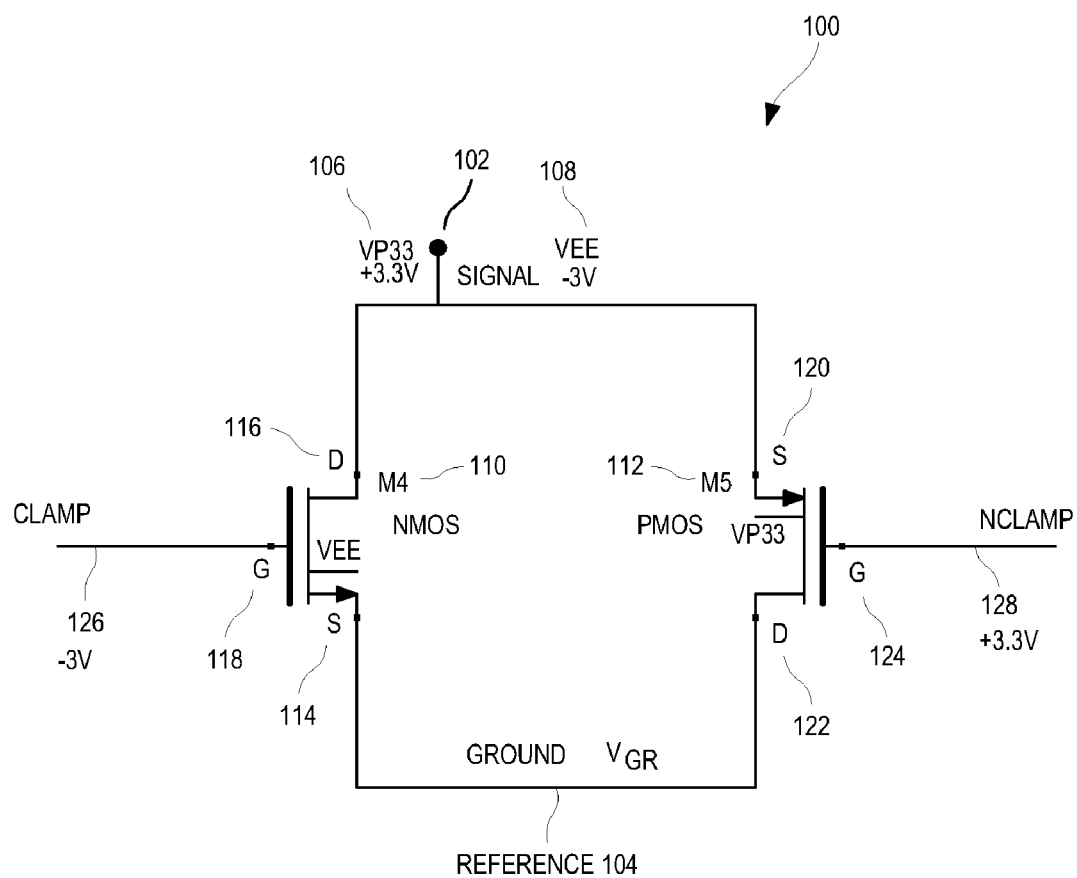
FIG. 1 illustrates an exemplary clamp circuit for a bipolar signal.

FIG. 1 illustrates an exemplary clamp circuit 100. In particular, FIG. 1 illustrates a clamp circuit 100 for a bipolar signal, wherein the signal 102 can be greater than or less than a reference voltage 104. In one example, the reference voltage 104 (VGR) may be ground potential and the signal 102 may swing between a first voltage 106 (VP33) and a second voltage 108 (VEE). The clamp circuit 100 can be used to clamp the signal 102 that swings between first voltage 106 (VP33) and second voltage 108 (VEE) to reference voltage 104 (VGR).

The clamp circuit 100 includes a nmos device 110 and a pmos device 112. The nmos device 110 and pmos device 112 may be field effect transistors (FETs), for example, metal oxide semiconductor FETs (MOSFETs). The nmos device 110 includes a source 114, drain 116 and gate 118. The pmos device 112 includes a source 120, drain 122 and gate 124. The drain 116 of nmos device 110 is coupled to signal 102 and the source 114 of nmos device 110 is coupled to reference voltage 104. The source 120 of pmos device 112 is coupled to signal 102 and the drain 122 of pmos device 112 is coupled to reference voltage 104.

The gate 118 of nmos device 110 is configured to receive a first control signal 126 and the gate 124 of pmos device 112 is configured to receive a second control signal 128. In one embodiment, the second control signal 128 is a logic inversion of first control signal 126.

As previously indicated, the clamp circuit 100 can be used to clamp the signal 102 that swings between first voltage 106 (VP33) and second voltage 108 (VEE) to reference voltage 104 (VGR). Exemplary operation of the clamp circuit 100 will now be described. For example, the clamp circuit 100 can be used to clamp the signal 102 that swings between +3.3V (VP33) and −3V (VEE) to ground potential (VEE), when the nmos device 110 and pmos device 112 are on.

In order to turn off nmos device 110, the first control signal 126 is set to be substantially equal to VEE (in this example, −3V), so as to bias the gate 118 at or about VEE. In order to turn off pmos device 112, the second control signal is set to be substantially equal to VP33 (in this example, +3.3V), so as to bias the gate 114 at or about VP33. Under this gate bias condition, the signal 102 can swing between VP33 (+3.3V) and VEE(−3V) and yet, the nmos device 110 and pmos device 112 will be off.

With the gate 118 of nmos device 110 biased to about VEE (−3 V), when the signal 102 is at or about VP33 (+3.3 V), the nmos device 110 is subjected to a voltage of about VP33-VEE between gate 118 and drain 116, which in this example is about 6.3V. With the gate 124 of pmos device 112 biased to about VP33 (+3.3V), when the signal 104 is at or about VEE, the pmos device is subjected to a voltage of about VP33-VEE between gate 124 and source 120, which in this example is about 6.3V. When the clamp 100 is in its high impedance state (off), both the nmos device 110 and pmos device 112 of the clamp 100 are subjected to full swing of source 102 voltage, in this example, 6.3V.

For example, devices fabricated in 3.5 um CMOS technology can tolerate about 10V across their gate oxide and drain-to-source voltage. So, clamp circuit 100 may be fabricated using 3.5 um CMOS technology, as the clamp circuit 100 subjects the nmos device 110 and pmos device 112 to about 6.3V, when the signal 102 swings between VP33 (+3.3V) and VEE (−3V). However, as the CMOS device dimensions are scaled down, the nmos and pmos devices may not tolerate the signal 102 swings between VP33 (+3.3V) and VEE (−3V). As an example, devices fabricated using 0.25 um CMOS technology may only be rated to tolerate about 3.6V voltage stress. For example, the clamp circuit 100 of FIG. 1 may not be used in devices fabricated using 0.25 um CMOS technology, as the nmos device 110 and pmos device 112 are subjected to about 6.3V, which is significantly higher than the maximum permitted voltage across the nmos and pmos devices.

Figure 2A:
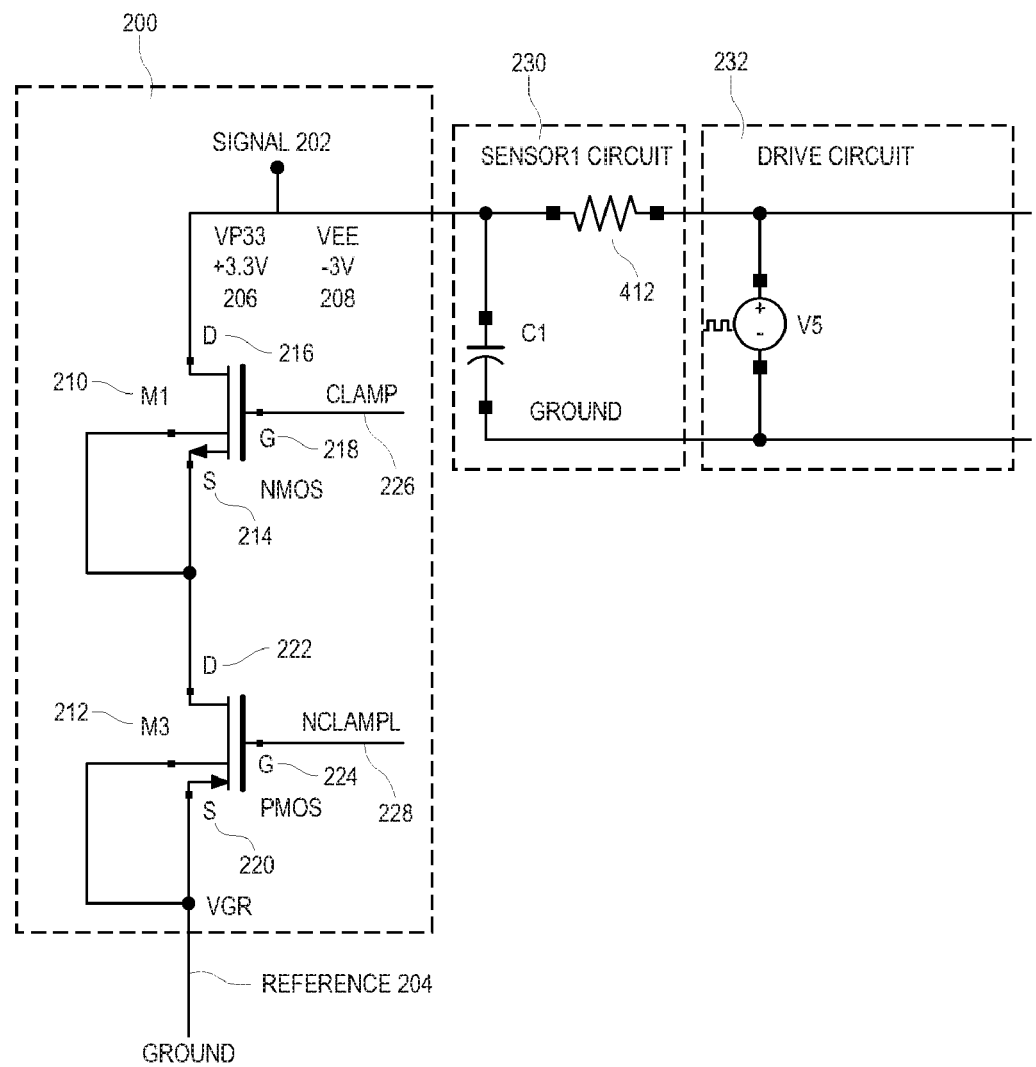
FIG. 2A illustrates an exemplary clamp circuit with a pmos and a nmos device, with the nmos device coupled to a signal according to one embodiment.

FIG. 2A illustrates an exemplary clamp circuit with a pmos and a nmos device, with the nmos device coupled to a signal according to one embodiment. In particular, FIG. 2A illustrates a clamp circuit 200 for a bipolar signal, wherein the signal 202 can be greater than or less than a reference voltage 204. In one example, the reference voltage 204 (VGR) may be ground potential and the signal 202 may swing between a first voltage 206 (VP33) and a second voltage 208 (VEE). The clamp circuit 200 can be used to clamp the signal 202 that swings between first voltage 206 (VP33) and second voltage 208 (VEE) to reference voltage 204 (VGR), without unduly stressing the pmos device and nmos device.

The clamp circuit 200 includes a nmos device 210 and a pmos device 212. The nmos device 210 and pmos device 212 may be field effect transistors (FETs), for example, metal oxide semiconductor FETs (MOSFETs). The nmos device 210 includes a source 214, drain 216 and gate 218. The pmos device 212 includes a source 220, drain 222 and gate 224. The nmos device 210 may be similar to nmos device 110. The pmos device 212 may be similar to pmos device 112.

The drain 216 of nmos device 210 is coupled to signal 102 and the source 214 of nmos device 210 is coupled to drain 222 of pmos device 212. The source 220 of pmos device 212 is coupled to reference voltage 204.

The gate 218 of nmos device 210 is configured to receive a first control signal 226 and the gate 224 of pmos device 212 is configured to receive a second control signal 228. In one embodiment, the second control signal 228 may be a logic inversion of first control signal 226.

As previously indicated, the clamp circuit 200 can be used to clamp the signal 202 that swings between first voltage 206 (VP33) and second voltage 208 (VEE) to reference voltage 204 (VGR). Exemplary operation of the clamp circuit 200 will now be described. For example, the clamp circuit 200 can be used to selectively clamp the signal 202 that swings between +3.3V (VP33) and −3V (VEE) to ground potential (VGR) (this mode sometimes referred to as "Clamp On" mode) or let the signal 202 to swing between VP33 and VEE (this mode sometimes referred to as "Clamp Off" mode).

In order to operate the clamp circuit in the Clamp Off mode when the signal 202 swings between VP33 and VEE, the first control signal 226 and the second control signal 228 that bias the gates of nmos device 210 and the pmos device 212 are set to be about the reference voltage VGR. Under this gate bias condition, the nmos device 210 will be off when the signal 202 is above the reference voltage VGR. Further, the pmos device 212 will be off when the signal 202 is below the reference voltage VGR. Under these conditions, either the nmos device 210 is off or the pmos device 212 is off, when the signal 202 swings between VP33 and VEE.

With the gate 218 of nmos device 210 biased to about VGR (0V), when the signal 202 is at or about VP33 (+3.3V), the nmos device 210 is off and subjected to a voltage of about VP33-VGR between gate 218 and drain 216, which in this example is about 3.3V.

When the signal 202 swings below the reference voltage (VGR), the nmos device 210 is biased on and will act as a closed switch. This will present substantially all of the signal 202 voltage at the drain 222 of pmos device 212. However, with the gate 224 of pmos device 212 biased to about VGR (0V), the pmos device 212 is biased off. So, when the signal 202 is at or about VEE (−3.0V), the pmos device 212 is subjected to a voltage of about VGR-VEE between gate 224 and drain 222, which in this example is about 3V.

In order to operate the clamp circuit 200 in the Clamp On mode when the signal 202 swings between VP33 and VEE, the first control signal 226 is set to about VP33 and the second control signal 228 is set to about VEE. The first control signal 226 turns on the nmos device 210 and the second control signal 228 turns on the pmos device 212. Under this gate bias condition, both the nmos device 210 and pmos device 212 will be in their low impedance state thereby pulling signal 202 to the reference voltage VGR.

Therefore, in the clamp circuit 200, during the operation of the clamp 200, both the nmos device 210 and pmos device 212 of the clamp 200 are subjected to a voltage swing that is less than the full swing of source 102 voltage, in this example, less than 6.3V. In one exemplary embodiment, the nmos device 210 and the pmos device 212 are subjected to no more than the higher of the voltage difference between the first voltage and the reference voltage or the second voltage and the reference voltage.

In one embodiment, signal 202 may be generated by a drive source 232 and coupled to a sensor 1 circuit 230. In one embodiment, the clamp circuit 200 is used to clamp the sensor 1 circuit 230 as described herein above. In one embodiment, the sensor 1 circuit 230 may be a sensor used in a disk drive.

Figure 2B:
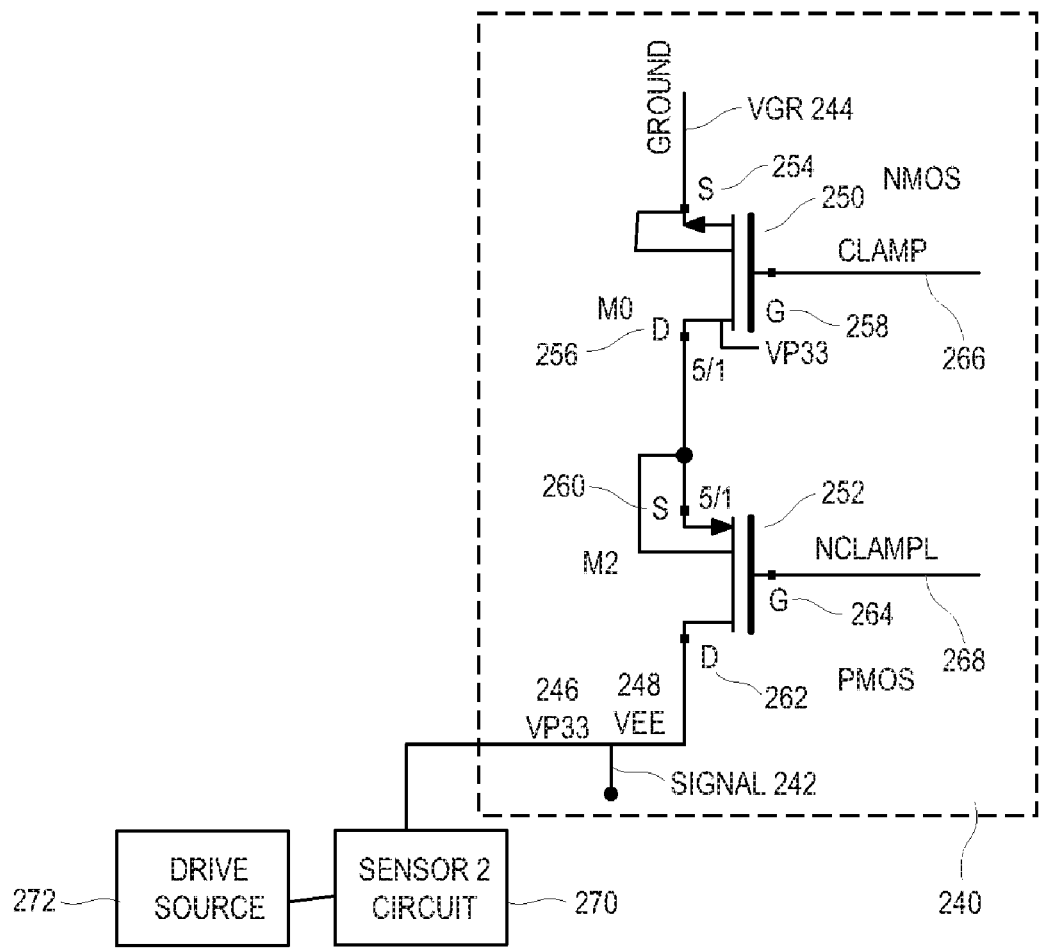
FIG. 2B illustrates another exemplary clamp circuit with a pmos device and a nmos device, with the pmos device coupled to another signal according to one embodiment.

FIG. 2B illustrates another exemplary clamp circuit with a pmos and a nmos device, with the pmos device coupled to a signal according to one embodiment. In particular, FIG. 2B illustrates a clamp circuit 240 for bipolar signal, wherein the signal 242 can be greater than or less than a reference voltage 244. In one example, the reference voltage 244 (VGR) may be ground potential and the signal 242 may swing between a first voltage 246 (VP33) and a second voltage 248 (VEE). The clamp circuit 240 can be used to clamp the signal 242 that swings between first voltage 246 (VP33) and second voltage 248 (VEE) to reference voltage 244 (VGR), without unduly stressing the pmos device and nmos device.

The clamp circuit 240 includes a nmos device 250 and a pmos device 252. The nmos device 250 and pmos device 252 may be field effect transistors (FETs), for example, metal oxide semiconductor FETs (MOSFETs). The nmos device 250 includes a source 254, drain 256 and gate 258. The pmos device 252 includes a source 260, drain 262 and gate 264. The nmos device 250 may be similar to nmos device 110. The pmos device 252 may be similar to pmos device 112.

The drain 262 of pmos device 252 is coupled to signal 242 and the source 260 of pmos device 252 is coupled to drain 256 of nmos device 250. The source 254 of nmos device 250 is coupled to reference voltage 244.

The gate 258 of nmos device 250 is configured to receive a first control signal 266 and the gate 264 of pmos device 252 is configured to receive a second control signal 268. In one embodiment, the second control signal 268 may be a logic inversion of first control signal 266.

As previously indicated, the clamp circuit 240 can be used to clamp the signal 242 that swings between first voltage 246 (VP33) and second voltage 248 (VEE) to reference voltage 244 (VGR). Operation of the clamp circuit 240 is similar to the operation of clamp circuit 200, with similar values for the first control signal and the second control signal. Exemplary operation of the clamp circuit 240 will now be briefly described.

For example, the clamp circuit 240 can be used to selectively clamp the signal 242 that swings between +3.3V (VP33) and −3V (VEE) to ground potential (VGR) (this mode sometimes referred to as "Clamp On" mode) or let the signal 242 to swing between VP33 and VEE (this mode sometimes referred to as "Clamp Off" mode).

In order to operate the clamp circuit in the Clamp Off mode when the signal 242 swings between VP33 and VEE, the first control signal 266 and the second control signal 268 that bias the gates of nmos device 250 and the pmos device 252 are set to be about the reference voltage VGR.

Under this gate bias condition, the pmos device 252 will be off when the signal 242 is below the reference voltage VGR. When the signal 242 is above the reference voltage VGR, the pmos device 252 is in forward bias condition and act as a closed switch, with low impedance condition. However, the nmos device 250 will be off when the signal 242 is above the reference voltage VGR. Under these conditions, either the nmos device 250 is off or the pmos device 252 is off, when the signal 242 swings between VP33 and VEE.

With the gate 264 of pmos device 252 biased to about VGR (0V), when the signal 242 is at or about VEE (−3V), the pmos device 252 is off and subjected to a voltage of about VGR-VEE between gate 264 and drain 262, which in this example is about 3.0V.

With the gate 258 of nmos device 250 biased to about VGR (0V), when the signal 242 is at or about VP33 (+3.3V), the nmos device 210 is off and subjected to a voltage of about VP33-VGR between gate 258 and drain 256, which in this example is about 3.3V.

In order to operate the clamp circuit 240 in the Clamp On mode when the signal 242 swings between VP33 and VEE, the first control signal 266 is set to about VP33 and the second control signal 268 is set to about VEE. The first control signal 266 turns on the nmos device 250 and the second control signal 268 turns on the pmos device 252. Under this gate bias condition, both the nmos device 250 and pmos device 252 will be in their low impedance state thereby pulling signal 242 to the reference voltage VGR 244.

Therefore, in the clamp circuit 240, during the operation of the clamp 240, both the nmos device 250 and pmos device 252 of the clamp 240 are subjected to a voltage swing that is less than the full swing of source 242 voltage, in this example, less than 6.3V. In one exemplary embodiment, the nmos device 250 and the pmos device 252 are subjected to no more than the higher of the voltage difference between the first voltage and the reference voltage or the second voltage and the reference voltage.

In one embodiment, signal 242 may be generated by a drive source 272 and coupled to a sensor 2 circuit 270. In one embodiment, the clamp circuit 240 is used to clamp the sensor 2 circuit 270 as described herein above. In one embodiment, the sensor 2 circuit 270 may be a sensor used in a disk drive. In one embodiment, the sensor 2 circuit 270 may be similar to sensor 1 circuit 230. In one embodiment, the drive source 272 may be similar to drive source 232. In one embodiment, a single drive source may be used to drive a plurality of sensor circuits.

Figure 3A:
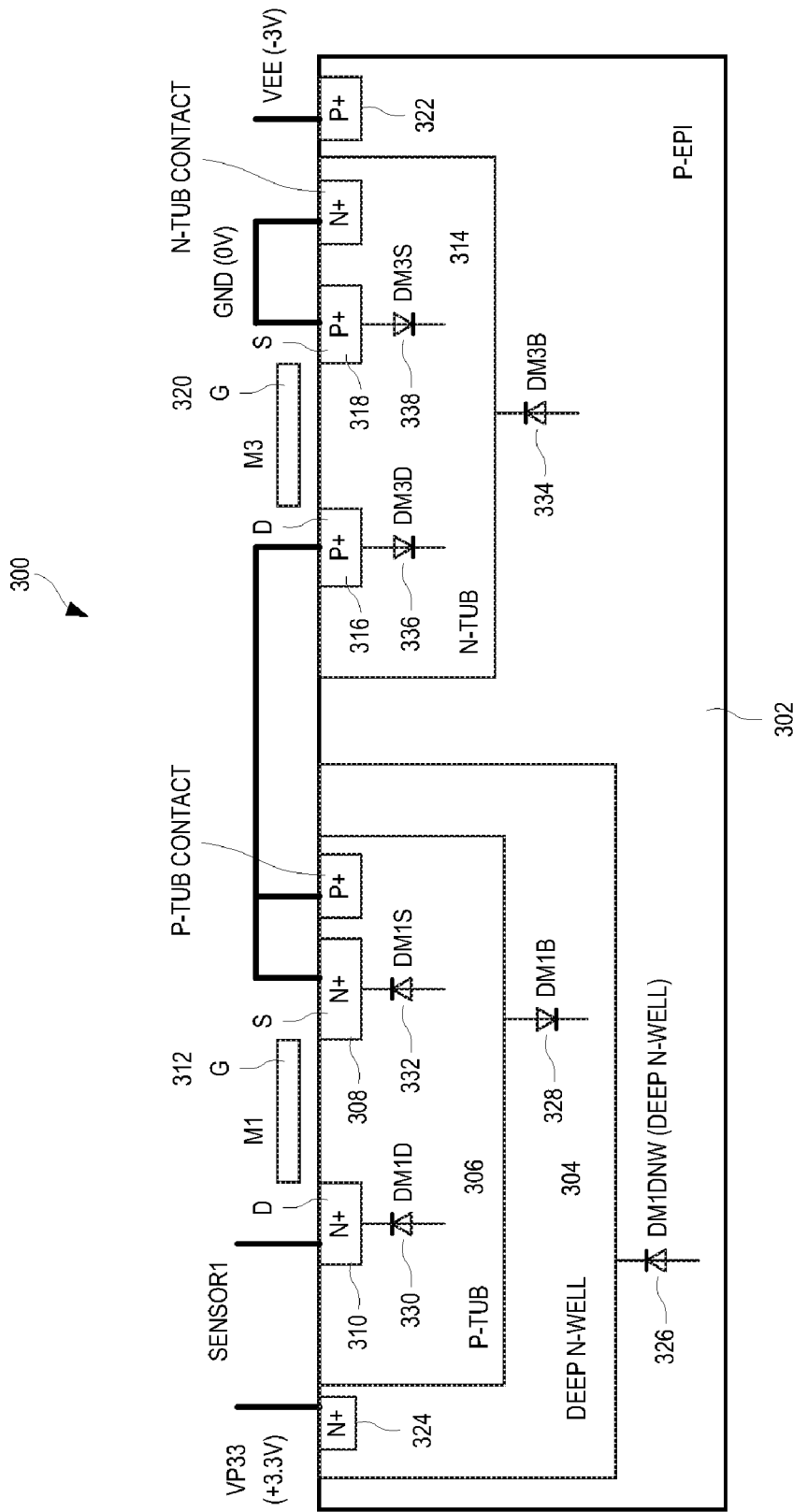
FIG. 3A illustrates cross section of exemplary clamp circuit of FIG. 2A fabricated in a semiconductor, using a triple-well CMOS configuration.

FIG. 3A illustrates cross section of an exemplary clamp circuit 300 fabricated in a semiconductor, using a triple-well CMOS configuration. More specifically, FIG. 3A illustrates pmos device and nmos device fabricated with tubs that can be electrically isolated from the epitaxial substrate by reverse biased diffusion junctions. The clamp circuit 300 is operationally similar to the clamp circuit 200 described with reference to FIG. 2A.

Now referring to FIG. 3A, in the fabrication of clamp circuit 300, a P⁻ type semiconductor substrate 302 is utilized and a pmos device and a nmos device is fabricated.

Nmos device is fabricated as follows. A deep N-well 304 is formed in the E substrate 302 and a P-tub 306 is formed in the N-well 304. A N+ type source 308 is formed in the P-tub 306. A N+ type drain 310 is formed in the P-tub 306. A gate electrode 312 is provided between source 308 and drain 310. Drain 310 is configured to receive signal 202.

Pmos device is fabricated as follows. A N-tub 314 is formed in the P⁻ substrate 302. A P+ type drain 316 is formed in the N-tub 314. A P+ type source 318 is formed in the N-tub 314. A gate electrode 320 is provided between source 318 and drain 316. Source 318 is configured to couple to the reference voltage VGR. Drain 316 of pmos device is configured to couple to the source 308 of the nmos device.

A P+ connection region 322 is formed in the P⁻ substrate 302. The P+ connection region 322 is configured to receive voltage VEE. In the exemplary embodiment, voltage VEE is about −3V. A N+ connection region 324 is formed in the deep N-well 304. The N+ connection region 324 is configured to couple to voltage VP33. In the exemplary embodiment, voltage VP33 is +3.3V.

Various reverse biased diffusion junctions are formed in the clamp circuit 300 to electrically isolate the pmos device and the nmos device from the epitaxial substrate layer. A reverse biased diffusion junction DM1DNW 326 is formed between the N-well 304 and P⁻ substrate 302. A reverse biased diffusion junction DM1B 328 is formed between P-tub 306 and N-well 304. A reverse biased diffusion junction DM1D 330 is formed between drain 310 and P-tub 306. A reverse biased diffusion junction DM1S 332 is formed between source 308 and P-tub 306. A reverse biased diffusion junction DM3B 334 is formed between the N-tub 314 and P⁻ substrate 302. A reverse biased diffusion junction DM3D 336 is formed between drain 316 and N-tub 314. Finally, a reverse biased diffusion junction DM3S 338 is formed between source 318 and N-tub 314.

Figure 3B:
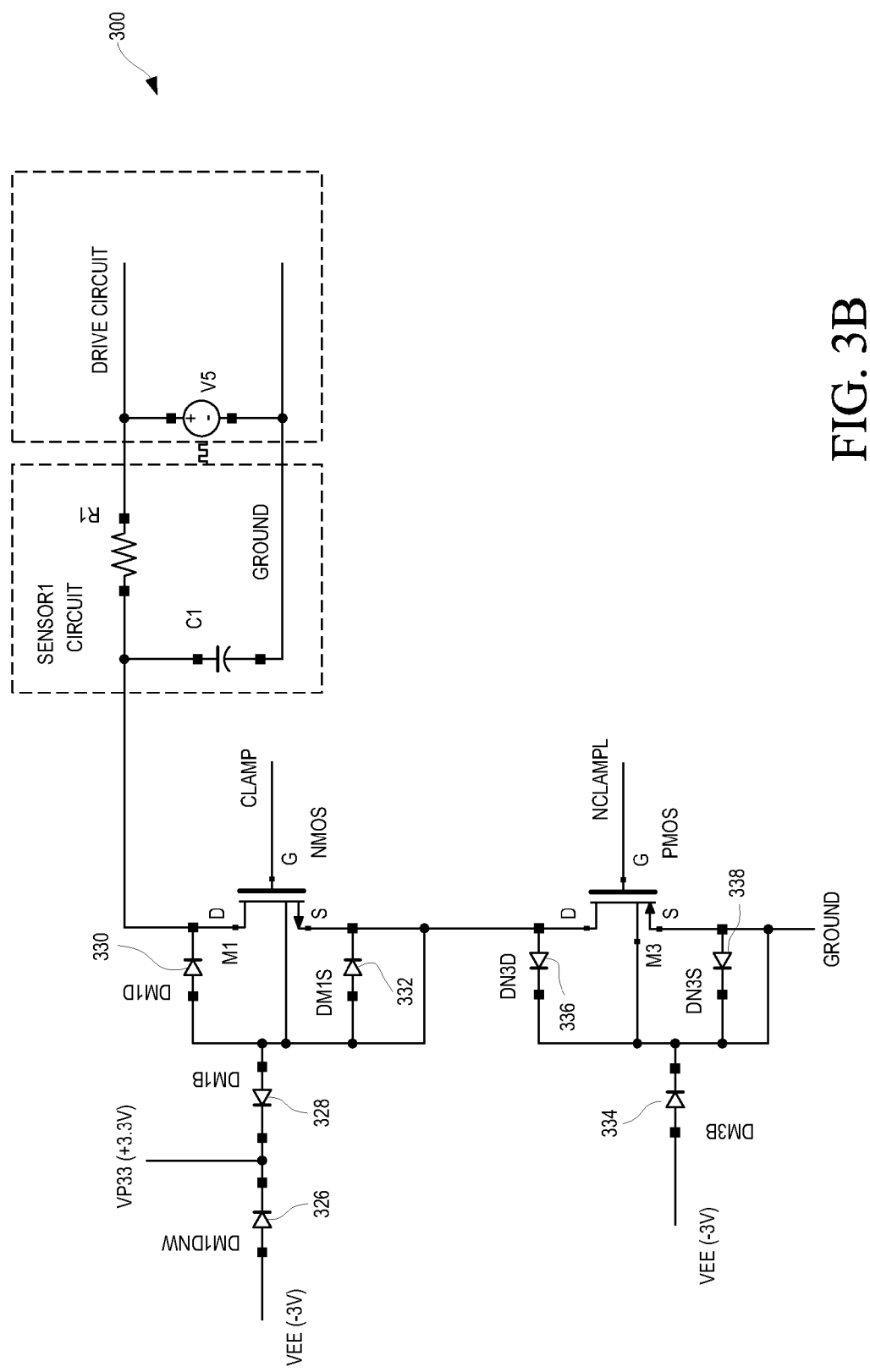
FIG. 3B illustrates electrical schematic representation of the clamp circuit of FIG. 3A, according to one embodiment.

FIG. 3B illustrates electrical schematic representation of the clamp circuit of FIG. 3A. More specifically, FIG. 3B illustrates various applied voltages, the reverse biased diffusion junctions and pmos device and nmos device.

Figure 4:
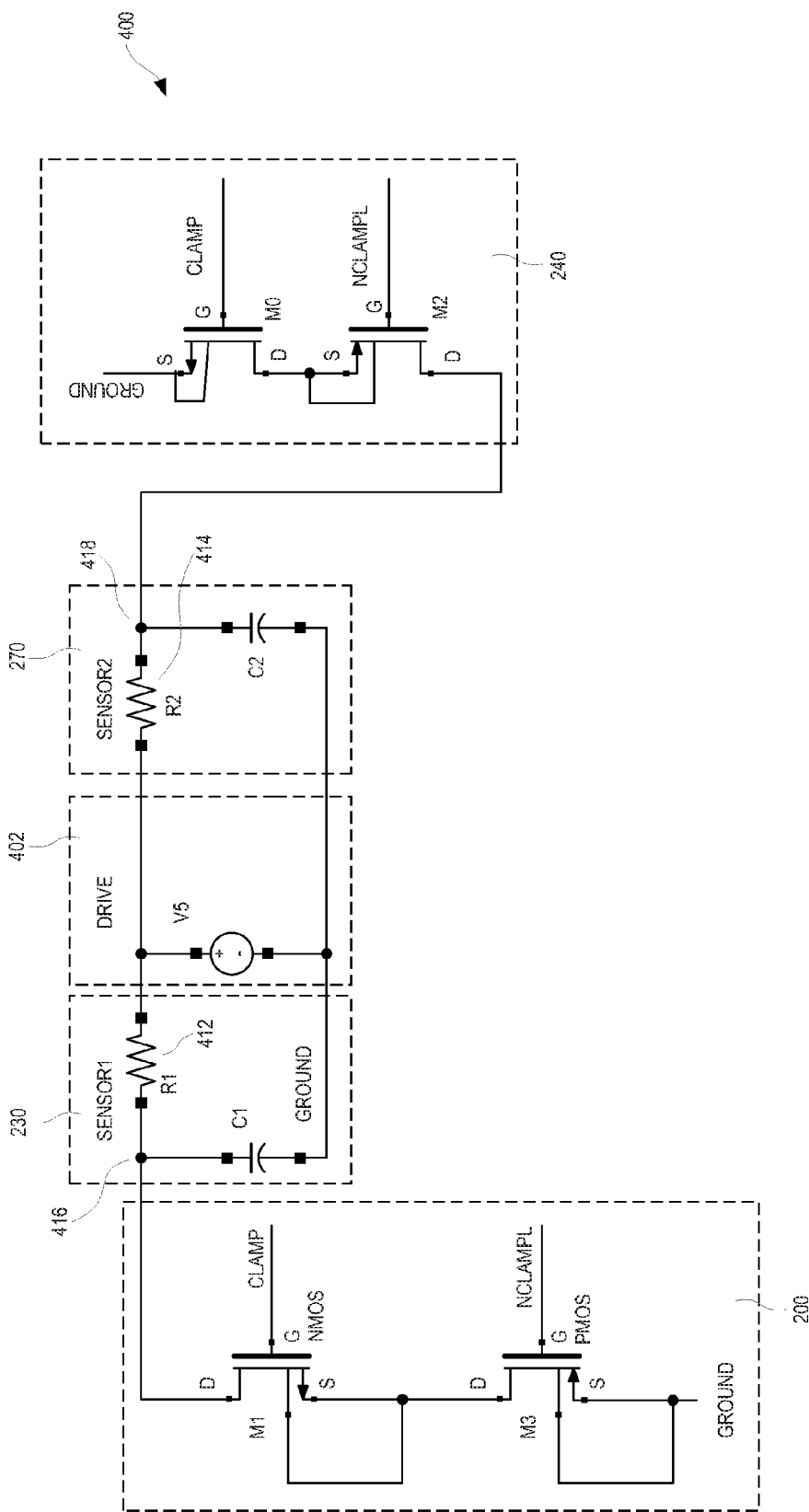
FIG. 4 illustrates an exemplary device with both embodiments of clamp circuits shown in FIG. 2A and FIG. 2B, coupled to sensors.

FIG. 4 illustrates an exemplary clamp device 400 with both embodiments of clamp circuits 200 and 240 shown in FIG. 2A and FIG. 2B, coupled to sensor 1 circuit 230 and sensor 2 circuit 270 respectively, with a common drive circuit 402.

Figure 4B:
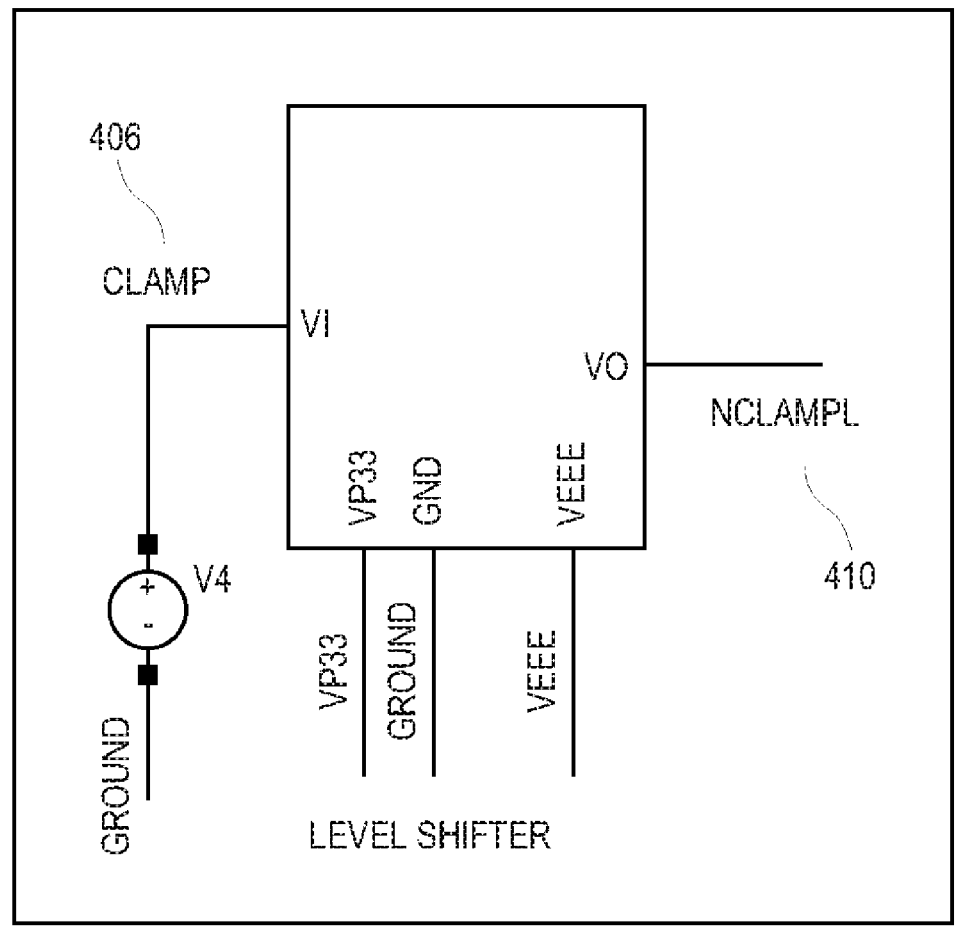
FIG. 4b illustrates an exemplary level shifter for use with clamp circuits shown in exemplary device of FIG. 4.

FIG. 4b illustrates an exemplary level shifter 404 that receives clamp 406 signal and generates nclampL 410 signal. In one embodiment, nclampL 410 signal is a logic inversion of clamp 406 signal and is level shifted down to swing between VEE and ground. The nclampL 410 signal generated by the level shifter 404 is used in the operation of the clamp device 400 of FIG. 4.

Now, exemplary operation of clamp device 400 of FIG. 4 is described with reference to exemplary waveforms of FIG. 5A and FIG. 5B.

The clamp circuits 200 and 240 are driven by the voltage from drive source 402. The sensor 1 resistor R1 412 and sensor 2 resistor R2 414 are each about 250 kOhms.

Figure 5A:
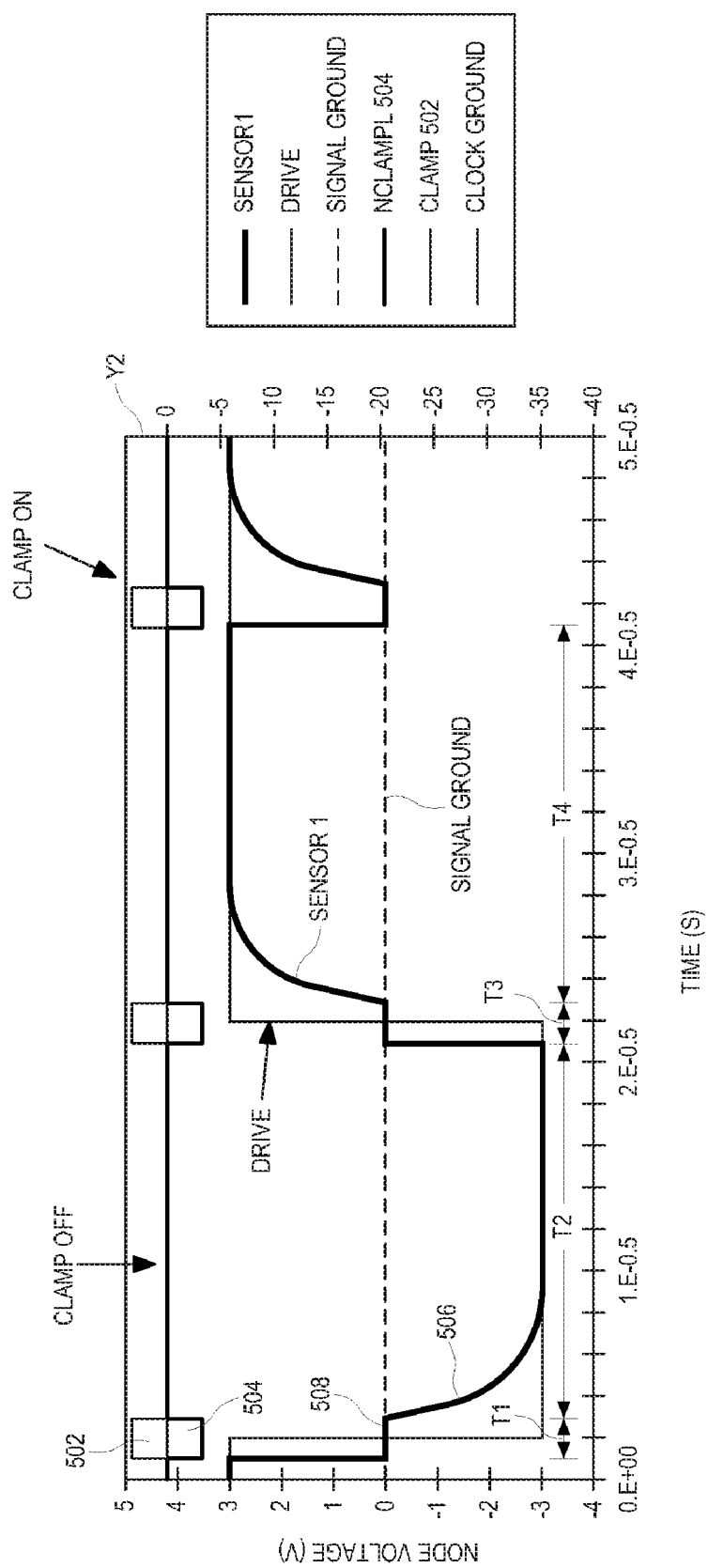
FIGS. 5A and 5B illustrate exemplary timing diagram for various signals of exemplary device of FIG. 4.

Now, referring to FIG. 5A, the waveform plots related to the operation of clamp circuit 200 is shown. The clamp 502 and nclampL 504 signal waveform over time are shown at the top of the plot with corresponding voltage levels shown along axis Y2. During time T1, When clamp 502 is high (VP33) and nclampL 504 is low (VEE), sensor 1 circuit node 416 (shown in FIG. 4) is clamped to ground as shown by sensor 1 circuit node voltage waveform 506 at 508. During time T2, when clamp 502 and nclamL 504 are at ground potential, the clamp circuit 200 is open and sensor 1 circuit 230 charges to the voltage on drive circuit 402. During time T2, the sensor 1 circuit node voltage charges to about −3V in this example. Similarly, during time T3, the sensor 1 circuit 230 is clamped to ground and during time T4, the sensor 1 circuit 230 charges to about +3V in this example. The waveforms of FIG. 5A show that the clamp circuit 200 has a high dc resistance when off to both positive and negative sensor 1 circuit node 416 voltages while having low impedance to ground when the clamp circuit 200 is on.

Figure 5B:
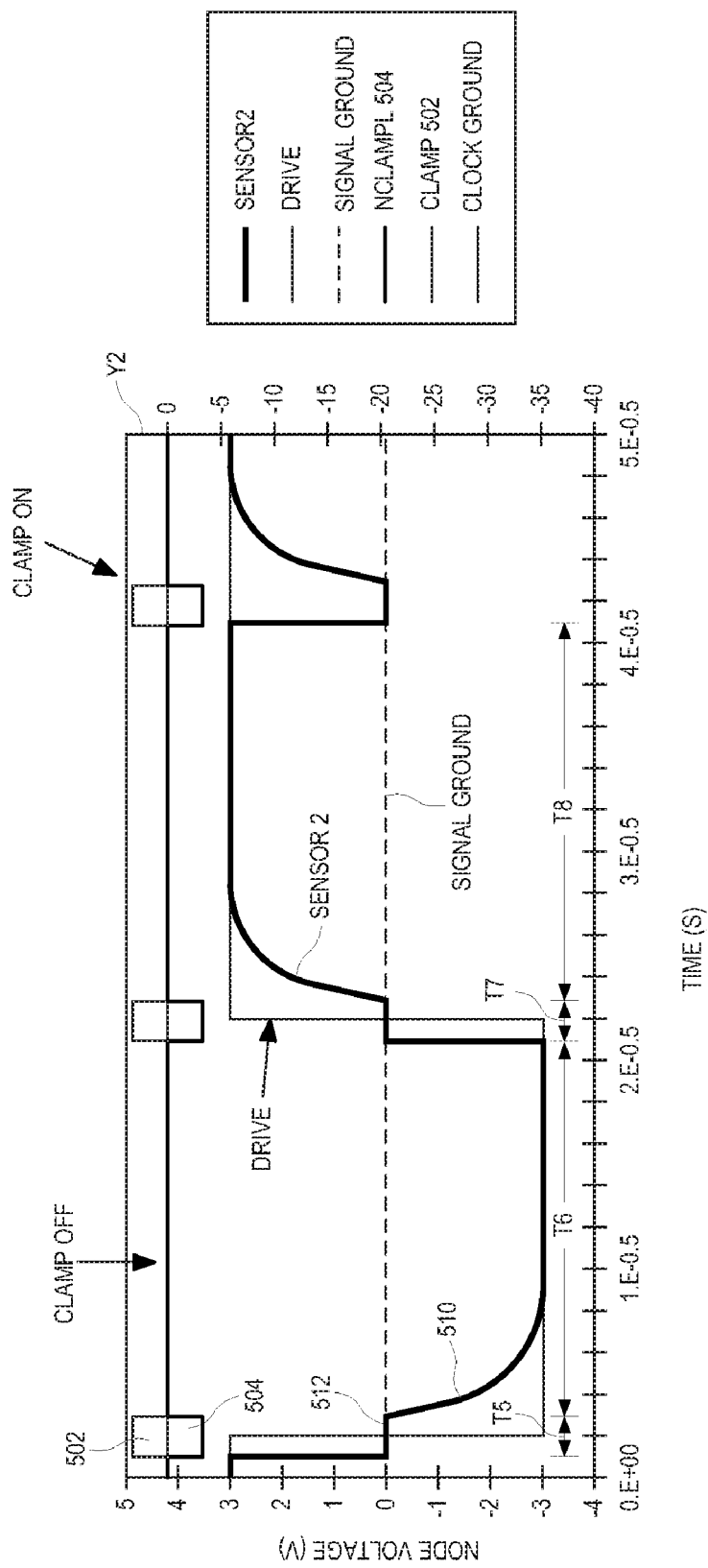

Now, referring to FIG. 5B, the waveform plots related to the operation of clamp circuit 240 is shown. The clamp 502 and nclampL 504 signal waveform over time are shown at the top of the plot with corresponding voltage levels shown along axis Y2. During time T5, When clamp 502 is high and nclampL 504 is low, sensor 2 node 418 (shown in FIG. 4) is clamped to ground as shown by sensor 2 circuit node voltage waveform 510 at 512. During time T6, when clamp 502 and nclampL 504 are at ground potential, the clamp circuit 240 is open and sensor 2 circuit 270 charges to the voltage on drive circuit 402. During time T6, the sensor 2 node voltage charges to about −3V in this example. Similarly, during time T7, the sensor 2 circuit is clamped to ground when clamp 502 is high and nclampL 504 is low. During time T8, when clamp 502 and nclampL 504 are at ground potential, the sensor 2 circuit charges to about +3V in this example. The waveforms of FIG. 5B show that the clamp circuit 240 has a high dc resistance when off to both positive and negative sensor 2 circuit node 418 voltages while having low impedance to ground when the clamp circuit 240 is on.

In various embodiments, the systems and devices described in FIGS. 1-5 may help to construct devices that are rated for voltages less than the voltage swing between the first voltage and the second voltage. As an example, in a 0.25 um CMOS technology, the devices are typically rated for voltages less than 3.6 volts across the CMOS device gate and between drain-to-source. A clamp circuit as described herein above may be constructed for use in such application.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., complementary metal-oxide-semiconductor (CMOS) based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated circuit (ASIC)).

What is claimed is:

1. A MOS-type semiconductor clamping circuit, comprising:
a pmos device coupled to a nmos device in series to form the clamping circuit to selectively clamp a signal to a reference voltage, the signal is configured to transition between a first voltage on a first side of the reference voltage and a second voltage on a second side of the reference voltage;
wherein the pmos device and the nmos device each including a source, a drain and a gate, wherein the gate of the nmos device is configured to receive a first control signal and wherein the gate of the pmos device is configured to receive a second control signal and the second control signal is a logic inversion of the first control signal; and
wherein when the signal transitions between the first voltage and the second voltage, the pmos device and the nmos device are subjected to a voltage differential that is less than the voltage difference between the first voltage and the second voltage by biasing the gate of the nmos device to be approximately the reference voltage using the first control signal when the signal is at or near the first voltage or by biasing the gate of the pmos device to be approximately the reference voltage using the second control signal when the signal is at or near the second voltage.

2. The circuit of claim 1, wherein a first set of values for the first control signal and the second control signal turn on both the nmos device and the pmos device, thereby turning on the clamping circuit and clamping the signal to the reference voltage.

3. The circuit of claim 1, wherein a second set of values for the first control signal and the second control signal turn off one of the nmos device and the pmos device, device, thereby turning off the clamping circuit.

4. The circuit of claim 2, wherein the signal is generated by a drive source and the signal is coupled to a sensor circuit and the clamping circuit, wherein the clamping circuit clamps the signal to the reference voltage when the clamping circuit is turned on.

5. The circuit of claim 1, wherein the first voltage is about 3.3 Volts, the second voltage is about −3.0 Volts and the reference voltage is about 0 volts.

6. A MOS-type semiconductor clamping circuit, comprising:
a pmos device coupled to a nmos device in series, the pmos device and the nmos device each including a source, a drain and a gate, wherein the gate of the nmos device is configured to receive a first control signal and wherein the gate of the pmos device is configured to receive a second control signal and the second control signal is a logic inversion of the first control signal;
wherein if the source of the nmos device is coupled to the drain of the pmos device, the source of the pmos device is coupled to a reference voltage and the drain of the nmos device is coupled to a signal configured to transition between a first voltage on a first side of the reference voltage and a second voltage on a second side of the reference voltage;
wherein if the source of the pmos device is coupled to the drain of the nmos device, the source of the nmos device is coupled to the reference voltage and the drain of the pmos device is coupled to the signal configured to transition between the first voltage and the second voltage; and
wherein when the signal transitions between the first voltage and the second voltage, the pmos device and the nmos device are subjected to a voltage differential that is less than the voltage difference between the first voltage and the second voltage by biasing the gate of the nmos device to be approximately the reference voltage using the first control signal when the signal is at or near the first voltage or by biasing the gate of the pmos device to be approximately the reference voltage using the second control signal when the signal is at or near the second voltage.

7. The clamping circuit of claim 6, wherein a first set of values for the first control signal and the second control signal turn on both the nmos device and the pmos device, thereby turning on the clamping circuit and clamping the signal to the reference voltage.

8. The clamping circuit of claim 6, wherein a second set of values for the first control signal and the second control signal turn off one of the nmos device and the pmos device, thereby turning off the clamping circuit.

9. The clamping circuit of claim 7, wherein the signal is generated by a drive source and the signal is coupled to a sensor circuit and the clamping circuit, wherein the clamping circuit clamps the signal to the reference voltage when the clamping circuit is turned on.

10. The clamping circuit of claim 6, wherein the first voltage is about 3.3 Volts, the second voltage is about −3.0 Volts and the reference voltage is about 0 volts.

* * * * *